(12) United States Patent
Takizawa (10) Patent No.: US 8,351,237 B2
(45) Date of Patent: Jan. 8, 2013

(54) FERROELECTRIC RANDOM ACCESS MEMORY AND MEMORY SYSTEM

(75) Inventor: Ryousuke Takizawa, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 12/873,119

(22) Filed: Aug. 31, 2010

(65) Prior Publication Data

US 2011/0051491 A1    Mar. 3, 2011

(30) Foreign Application Priority Data

Aug. 31, 2009   (JP) ................. 2009-199536

(51) Int. Cl.
  *G11C 11/22*    (2006.01)
(52) U.S. Cl. .............. 365/145; 365/189.05; 365/230.06; 365/230.03; 365/194
(58) Field of Classification Search .................. 365/145, 365/189.05, 230.06, 230.03, 194
See application file for complete search history.

(56) References Cited

U.S. PATENT DOCUMENTS

| | | | | |
|---|---|---|---|---|
| 6,262,939 B1 * | 7/2001 | Matsui | ...................... | 365/233.12 |
| 8,208,320 B2 * | 6/2012 | Kanda | ........................... | 365/191 |
| 2001/0014051 A1 * | 8/2001 | Watanabe et al. | ......... | 365/230.03 |
| 2010/0246280 A1 * | 9/2010 | Kanda | ...................... | 365/189.05 |

OTHER PUBLICATIONS

Takashima et al., "High Density Chain Ferroelectric Random Memory (CFeRAM)," Symposium on VLSI Circuits Digest of Technical Papers, pp. 83-84, Jun. 1997.
Background Art Information.

\* cited by examiner

*Primary Examiner* — Tuan T. Nguyen
(74) *Attorney, Agent, or Firm* — Knobbe, Martens, Olson & Bear, LLP (57) ABSTRACT

Certain embodiments provide a ferroelectric random access memory comprising a first buffer, a second buffer, a third buffer, a first controlling unit, a second controlling unit, a memory cell array, a sense amplifier circuit, and a third controlling unit. The first buffer outputs a first signal changed from a first value to a second value based on notification of power-down. The second buffer stops supply of inner clock signal with the change of the first signal from the first value to the second value. The third buffer receives an address signal corresponding to data to be read or written. The first controlling unit receives a command signal. The second controlling unit generates a basic signal that has a third value when the command signal indicates a bank active command and has a fourth value when the command signal indicates a precharge command and the first signal has the second value. The sense amplifier circuit reads data via a pair of bit lines from the memory cell corresponding to the address signal. The third controlling unit controls write back to the memory cell from which the data are read so as to be performed after an elapse of a predetermined time from the time the basic signal has the third value and when the basic signal has the fourth value.

10 Claims, 8 Drawing Sheets

FERROELECTRIC RANDOM ACCESS MEMORY AND MEMORY SYSTEM

CROSS REFERENCE TO RELATED APPLICATION

This application is based upon and claims benefit of priority from the Japanese Patent Application No. 2009-199536, filed on Aug. 31, 2009, the entire contents of which are incorporated herein by reference.

FIELD

Embodiments described herein relates generally to a ferroelectric random access memory and a memory system.

BACKGROUND

As a ferroelectric random access memory that reduces the area of a plate line driving circuit, a ferroelectric random access memory of a cell array type, a TC parallel type, and a unit series-connected type has been proposed (e.g., see D. Takashima et al., "High-density chain Ferroelectric random memory (CFeRAM)" in proc. VLSI Symp. June 1997, pp. 83-84). Both ends of a ferroelectric capacitor (C) are connected to the source and the drain of a cell transistor (T) to configure a unit. A plurality of unit cells is connected in series to configure a cell block.

The ferroelectric random access memory is a data destructive read type memory that takes out and reads the electric charge of the capacitor. To hold read data, as in the refresh operation of a DRAM, the data are required to be rewritten (written back) to a memory cell. However, in the event of power-down before performing rewrite during read of the data, the data remains destroyed and is lost.

DETAILED DESCRIPTION

Certain embodiments provide a ferroelectric random access memory comprising a first buffer, a second buffer, a third buffer, a first controlling unit, a second controlling unit, a memory cell array, a sense amplifier circuit, and a third controlling unit. The first buffer receives notification of power-down and outputs a first signal changed from a first value to a second value based on the notification. The second buffer generates and supplies an inner clock signal and stops the supply of the inner clock signal with the change of the first signal from the first value to the second value. The third buffer receives, holds, and outputs an address signal corresponding to data to be read or written. The first controlling unit receives a command signal from outside of the memory and outputs the command signal to inside of the memory. The second controlling unit generates and outputs a basic signal that has a third value when the command signal output from the first controlling unit indicates a bank active command and has a fourth value when the command signal indicates a precharge command and the first signal has the second value. A memory cell including a ferroelectric capacitor and a cell transistor is arrayed in the memory cell array. The sense amplifier circuit reads data via a pair of bit lines from the memory cell corresponding to the address signal. The third controlling unit controls write back to the memory cell from which the data are read so as to be performed after an elapse of a predetermined time from the time the basic signal has the third value and when the basic signal has the fourth value.

Hereafter, embodiments of the present invention will be described with reference to the drawings.

The bank active of a bank active command, the precharge of a precharge command, and a write command used in the following description mean terms standardized and defined by JEDEC.

First Embodiment

Figure 1:
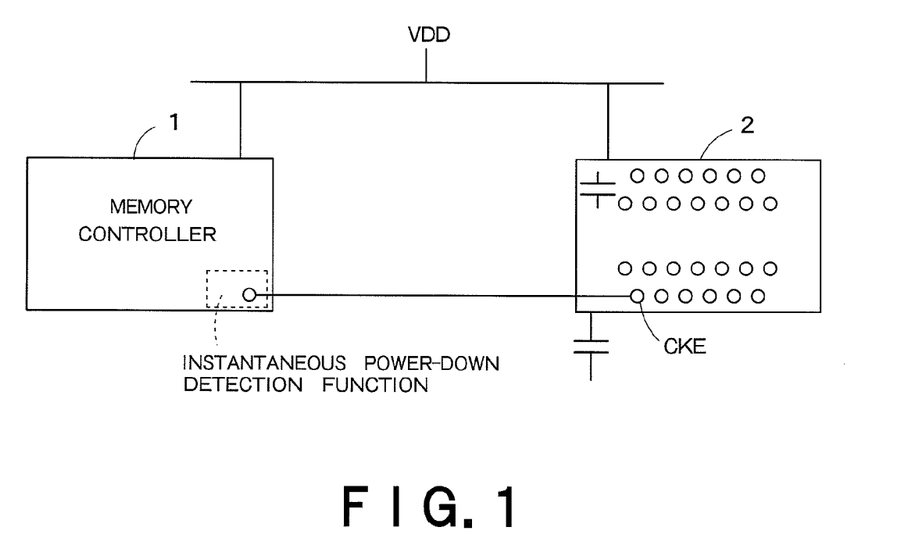
FIG. 1 is a schematic block diagram of a memory system according to a first embodiment of the present invention.
Figure 2:
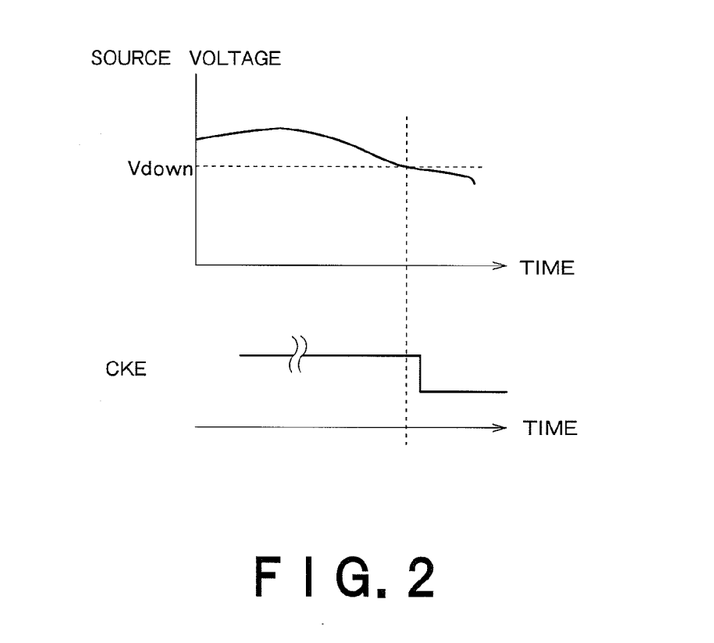
FIG. 2 is a transition diagram of a source voltage and the signal of a CKE pin when power-down notification is performed.

FIG. 1 shows the schematic configuration of a memory system according to a first embodiment of the present invention. The memory system has a memory controller 1, and a ferroelectric random access memory (FeRAM) 2. The memory controller 1 has an instantaneous power-down detection function, and provides notification of power-down to the ferroelectric random access memory 2 when the source voltage is below a predetermined value Vdown. In this embodiment, the ferroelectric random access memory 2 has a DDR interface, and power-down is notified using a CKE pin of the DDR interface. FIG. 2 shows an example of the transition of a source voltage and the signal of the CKE pin when power-down notification is performed. Power-down is notified by bringing the signal of the CKE pin to the low level.

Figure 3:
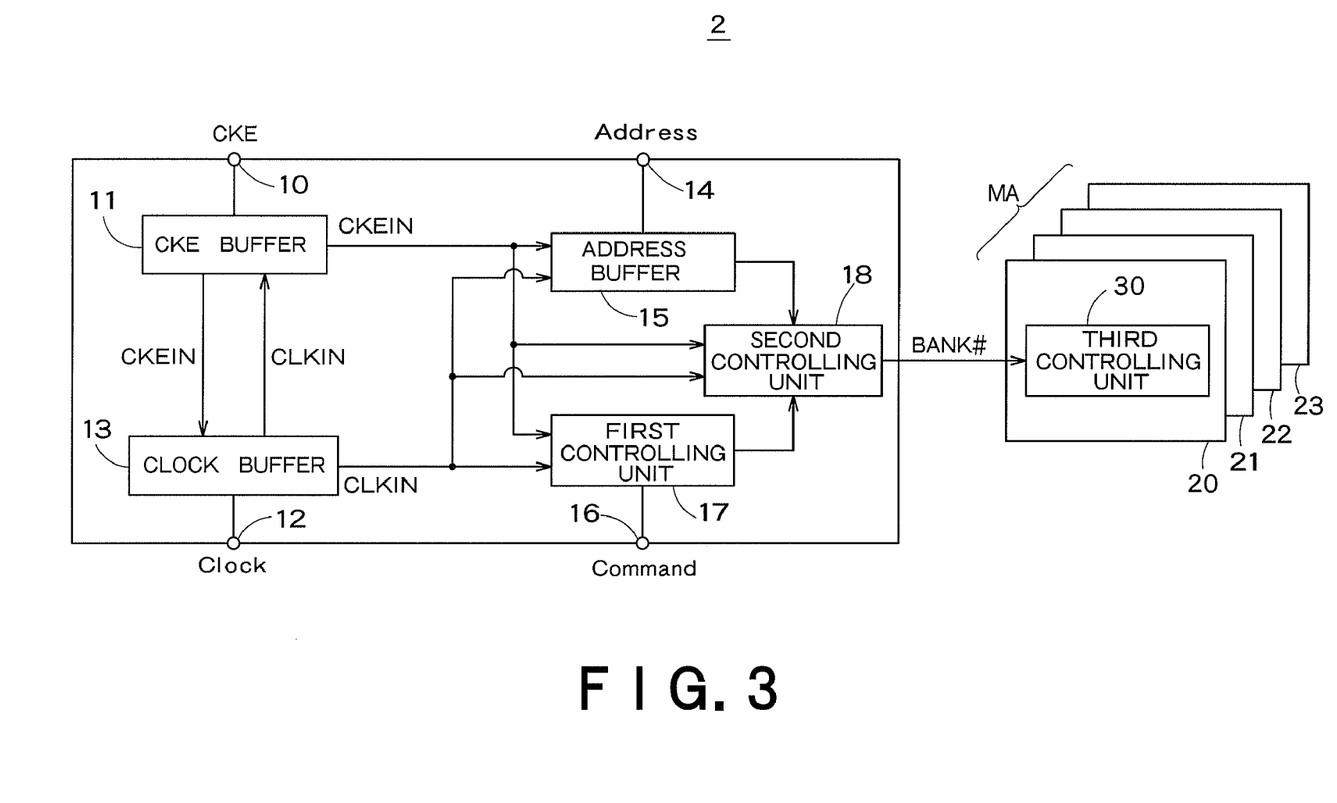
FIG. 3 is a schematic block diagram of a ferroelectric random access memory according to the first embodiment.

FIG. 3 shows the schematic configuration of the ferroelectric random access memory 2. The ferroelectric random access memory 2 has a CKE pin 10, a CKE buffer 11, a clock pin 12, a clock buffer 13, an address pin 14, an address buffer 15, a command pin 16, a first controlling unit 17, a second controlling unit 18, and a memory area MA. The ferroelectric random access memory 2 also has a power source stabilization capacitance (not shown) that takes a capacitance as a backup power source into consideration and can be operated for a fixed time in the event of power-down. As shown in FIG. 1, the power source stabilization capacitance may be provided as a power source stabilization capacitance inside the chip of the ferroelectric random access memory 2 or may be provided as a power source stabilization capacitance or a battery outside the chip on the power source line of the ferroelectric random access memory 2.

The memory area MA is divided into a plurality of banks and can be accessed in parallel. Here, as an example, the memory area MA is divided into four banks 20 to 23. Each of the banks has a third controlling unit 30.

Figure 4:
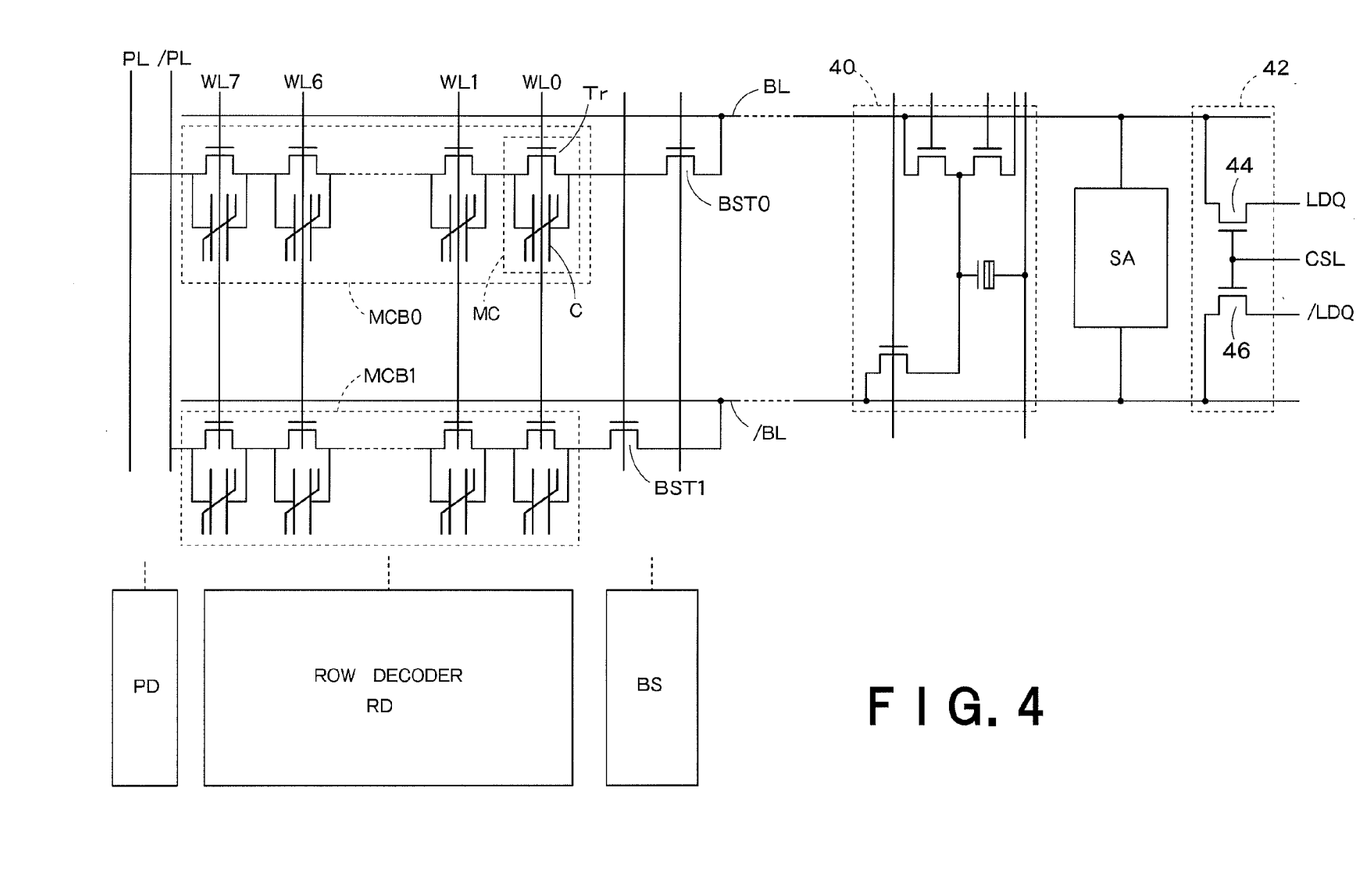
FIG. 4 is a schematic block diagram of a memory cell array according to the first embodiment.

FIG. 4 shows an example of the memory cell array of the memory area MA. One memory cell MC has a ferroelectric capacitor C and a cell transistor Tr that are connected in parallel. In this example, eight memory cells MC are connected in series to configure cell blocks MCB0 and MCB1. FIG. 4 shows the two cell blocks MCB0 and MCB1 connected to a pair of bit lines BL and /BL.

One end of the cell block MCB0 or MCB1 is connected to the bit line BL or /BL via a block selection transistor BST0 or BST1. The other end of the cell block MCB0 or MCB1 is connected to a plate line PL or /PL. The gates of the cell transistors Tr of the cell blocks MCB0 and MCB1 are connected to word lines WL0 to WL7. An equalize circuit 40, a sense amplifier circuit SA that detects and amplifies read data, and a column gate 42 are connected to the bit lines BL and /BL. A plate line driving circuit PD is connected to the plate lines PL and /PL. The column gate 42 is controlled by a column decoder (not shown).

A row decoder circuit RD that selects and drives the word line is connected to the word lines WL0 to WL7. The gates of block selection transistors BST0 and BST1 are connected to a block selection circuit BS that selects the cell block reading data.

Read data are output to an I/O terminal (not shown) via transistors 44 and 46 configuring the column gate 42, data lines LDQ and /LDQ, and a data buffer (not shown). Write data input from the I/O terminal are transferred via the data buffer to the sense amplifier circuit SA of the column selected by the column gate 42 and is written into the selected memory cell MC.

As shown in FIG. 3, the CKE buffer 11 generates an inner signal CKEIN from a signal received via the CKE pin 10, and outputs it to the clock buffer 13, the address buffer 15, the first controlling unit 17, and the second controlling unit 18. The clock buffer 13, the address buffer 15, and the first controlling unit 17 are enabled when the signal CKEIN is at the high level and are disabled when it is at the low level, thereby reducing power consumption.

Figure 5:
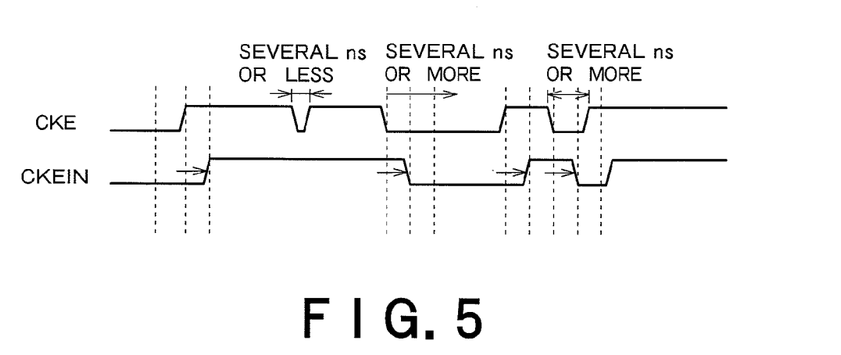
FIG. 5 is a diagram showing an example of the input signal and the output signal of a CKE buffer.

The CKE buffer 11 has a noise filter (not shown) that filters a pulse of about several ns as noise. FIG. 5 shows an example of the reception signal and the inner signal CKEIN generated of the CKE buffer 11.

The clock buffer 13 receives clock signals CLK and #CLK via the CLK pin 12. The clock buffer 13 uses the clock signals CLK and #CLK and the signal CKEIN to generate an inner clock signal CLKIN. The clock buffer 13 outputs the generated inner clock signal CLKIN to the CKE buffer 11, the address buffer 15, the first controlling unit 17, and the second controlling unit 18.

Figure 6:
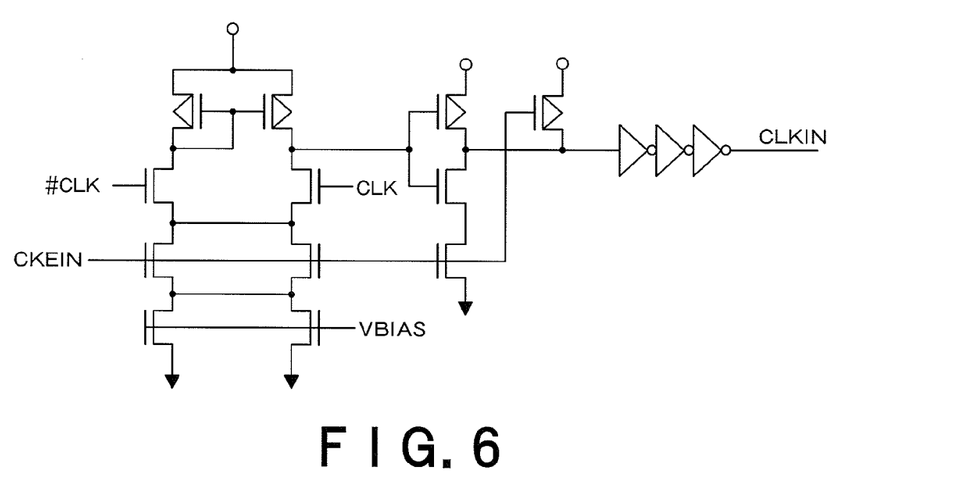
FIG. 6 is a schematic block diagram of a clock buffer according to the first embodiment.
Figure 7:
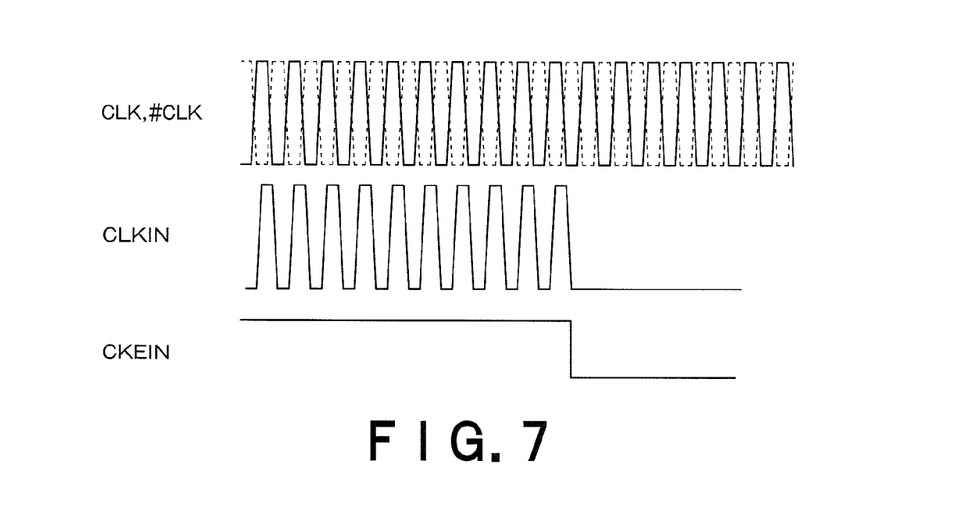
FIG. 7 is a diagram showing an example of an inner clock signal.

FIG. 6 shows an example of the configuration of the clock buffer 13. The clock buffer 13 of such configuration generates the inner clock signal CLKIN as shown in FIG. 7. With the transition of the signal CKEIN to the low level, the inner clock signal CLKIN is fixed to the low level to stop clock supply into the chip.

The address buffer 15 receives an address signal corresponding to data to be read/written from/into the memory controller 1 via the address pin 14, and outputs it to the second controlling unit 18.

The first controlling unit 17 receives a command signal from the memory controller 1 via the command pin 16, and outputs it to the second controlling unit 18.

The second controlling unit 18 generates a basic signal BANK# based on the signal CKEIN output from the CKE buffer 11 and the command signal output from the first controlling unit 17, and outputs it to the third controlling unit 30 of each of the banks. The basic signal BANK# is brought to the high level when a bank active command is given, and is brought to the low level when a bank precharge command is given. When the signal CKEIN is at the low level, the basic signal BANK# is brought to the low level.

Figure 8:
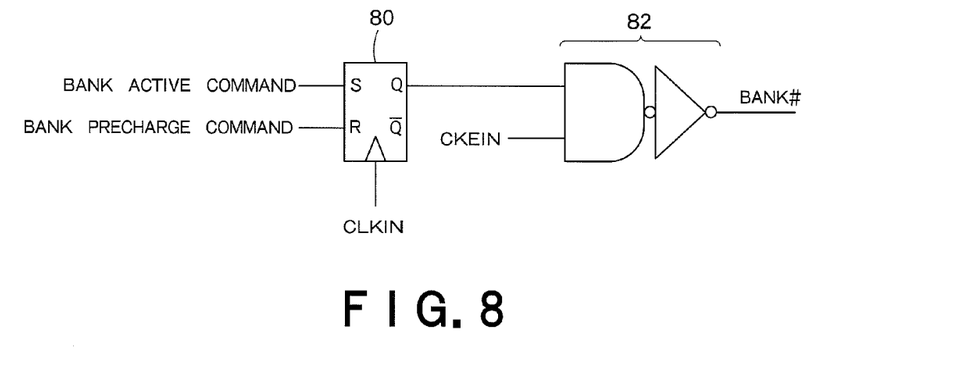
FIG. 8 is a schematic block diagram of a second controlling unit according to the first embodiment.

FIG. 8 shows an example of the circuit configuration of the second controlling unit 18 that generates such basic signal BANK#. The values of the bank active command and the bank precharge command are given to a flip-flop 80. The output of the flip-flop 80 and the signal CKEIN are given to an AND circuit 82. The basic signal BANK# is output from the AND circuit 82.

The second controlling unit 18 latches the row address of each of the banks according to the bank address at the time of the bank active command, and outputs it to the row decoder circuit RD. The second controlling unit 18 outputs the column address to the column decoder.

The second controlling unit 18 performs these controls by clock synchronization. When the signal CKEIN is brought to the low level, the basic signal BANK# is changed to the low level asynchronously.

The third controlling unit 30 has an RC delaying circuit (not shown), and generates a timer signal BANKTIMER that is brought to the high level on the rising edge of the basic signal BANK# and is brought to the low level after it maintains the high level for a predetermined time. Here, the predetermined time in which the timer signal BANKTIMER maintains the high level is longer than a time necessary for reading (transferring) data from the memory cell to be read/written to the sense amplifier circuit SA.

Figure 9A:
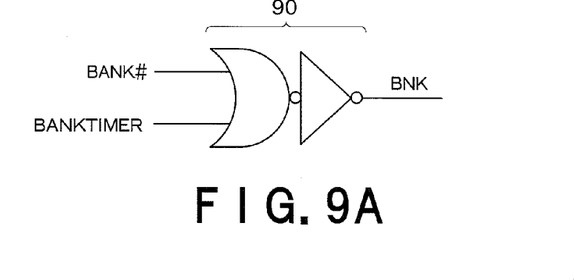
FIG. 9A is a diagram showing a schematic configuration of a third controlling unit according to the first embodiment.
Figure 9B:
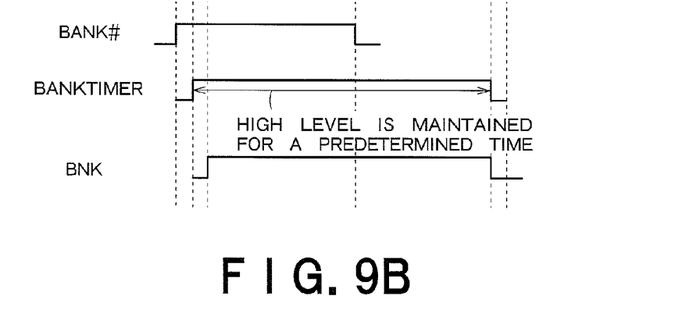
FIG. 9B is a diagram showing an example of output signal of the third controlling unit.

As shown in FIG. 9A, the third controlling unit has an OR circuit 90 that inputs the basic signal BANK# and the timer signal BANKTIMER, and outputs a signal BNK. As shown in FIG. 9B, the signal BNK is brought to the high level with the rise of the basic signal BANK#, and is changed to the low level when both the basic signal BANK# and the timer signal BANKTIMER are brought to the low level.

With the change from the low level to the high level of the signal BNK, each of the banks transfers data of the memory cell MC to the sense amplifier circuit SA. With the change of the signal BNK from the high level to the low level, each of the banks writes back the data held by the sense amplifier circuit SA to the memory cell MC.

When the source voltage is below the predetermined value Vdown and power-down is notified from the memory controller 1, the signal CKEIN is brought to the low level and the basic signal BANK# is brought to the low level. When the data of the sense amplifier circuit SA are written back to the memory cell MC immediately after the basic signal BANK# is brought to the low level, all the data of the memory cell MC cannot be transferred to the sense amplifier circuit SA in the event of power-down immediately following the bank active command. Thus, the data can be lost.

However, in this embodiment, after the timer signal BANKTIMER is brought to the low level, the data of the sense amplifier circuit SA are written back to the memory cell MC. All the data of the memory cell MC is transferred to the sense amplifier circuit SA and is then written back so that data loss can be prevented.

Figure 10:
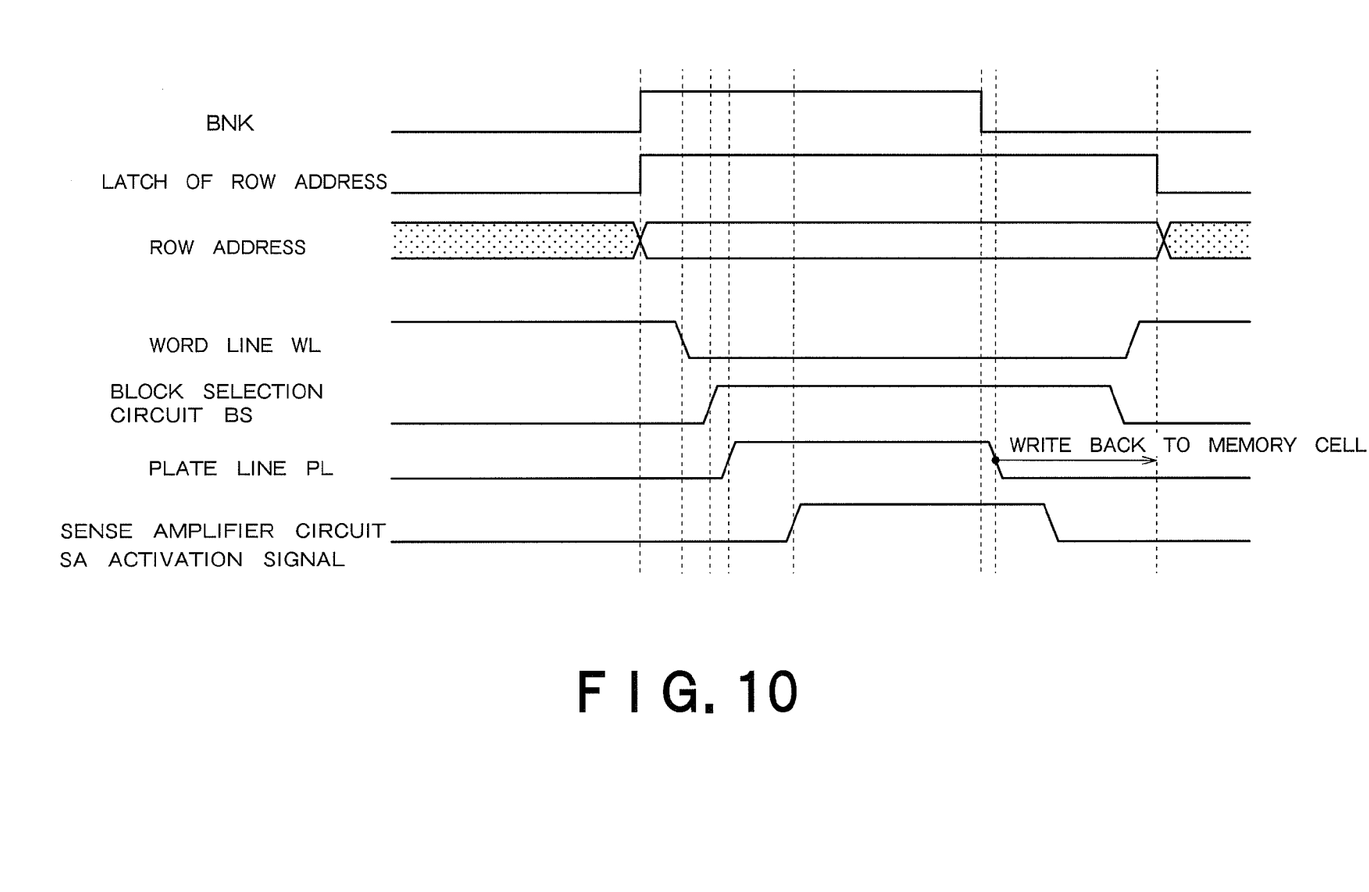
FIG. 10 is a transition diagram of the signals of the ferroelectric random access memory according to the first embodiment.

FIG. 10 shows an example of the transition of each signal in this embodiment. With the change of the signal BNK from the high level to the low level, the voltage of the plate line PL is changed from the high level to the low level to perform write (write back) to the memory cell MC.

In this embodiment, upon notification of power-down, after the data of the memory cell MC is transferred to the sense amplifier circuit SA, the data is written back to the memory cell MC so that data maintainability against instantaneous power-down can be improved.

In this embodiment, the example in which the CKE pin is used for notifying power-down from the memory controller 1 to the ferroelectric random access memory 2 has been described. An additionally set pin, not the CKE pin, may be used.

Second Embodiment

Figure 11:
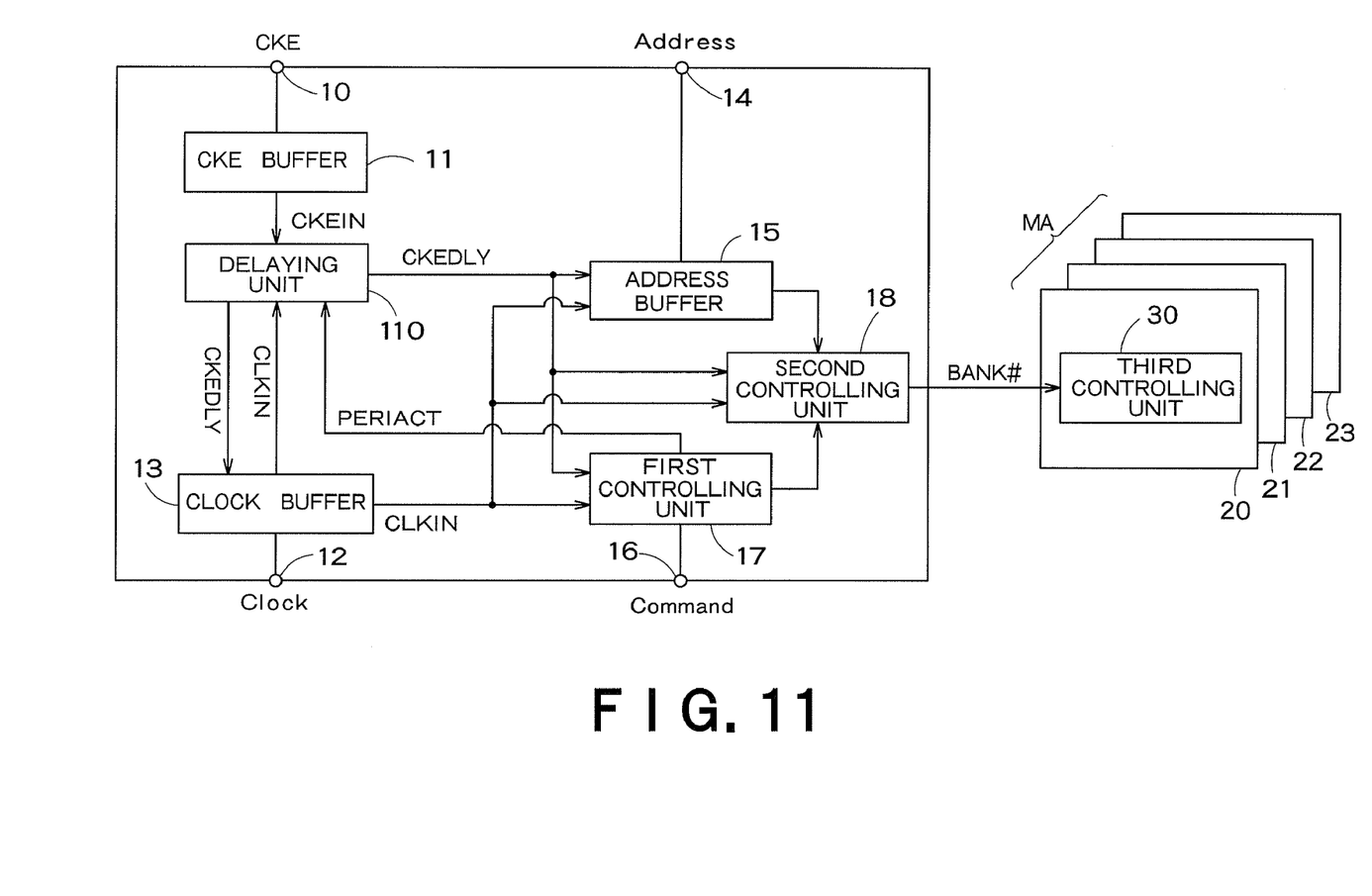
FIG. 11 is a schematic block diagram of the ferroelectric random access memory according to a second embodiment of the present invention.

FIG. 11 shows the schematic configuration of the ferroelectric random access memory 2 according to a second embodiment of the present invention. In this embodiment, in the event of power-down during writing of data, the data can be maintained.

The ferroelectric random access memory according to this embodiment has a delaying unit 110 provided in the ferroelectric random access memory according to the first embodiment shown in FIG. 3. The delaying unit 110 generates a signal CKEDLY based on the signal CKEIN received from the CKE buffer 11 and a signal PERIACT received from the first controlling unit 17. The delaying unit 110 outputs the generated signal CKEDLY to the CKE buffer 11, the address buffer 15, the first controlling unit 17, and the second controlling unit 18. The clock buffer 13, the address buffer 15, and the first controlling unit 17 are enabled when the signal CKEDLY is at the high level and are disabled when it is at the low level, thereby reducing power consumption.

The first controlling unit 17 generates a signal CSL that rises after an elapse of a predetermined time from the reception of write data to become a write trigger to the sense amplifier circuit SA. The signal CSL is changed to the low level after an elapse of a predetermined time from rise. The signal PERIACT is changed to the high level with the input of a write command, and is changed to the low level with the change of the signal CSL to the low level.

The delaying unit 110 changes the signal CKEDLY to the high level when the signal CKEIN is changed to the high level. The delaying unit 110 changes the signal CKEDLY to the low level with the change of the signal PERIACT to the low level.

The second controlling unit 18 generates the basic signal BANK# using the signal CKEDLY.

Figure 12:
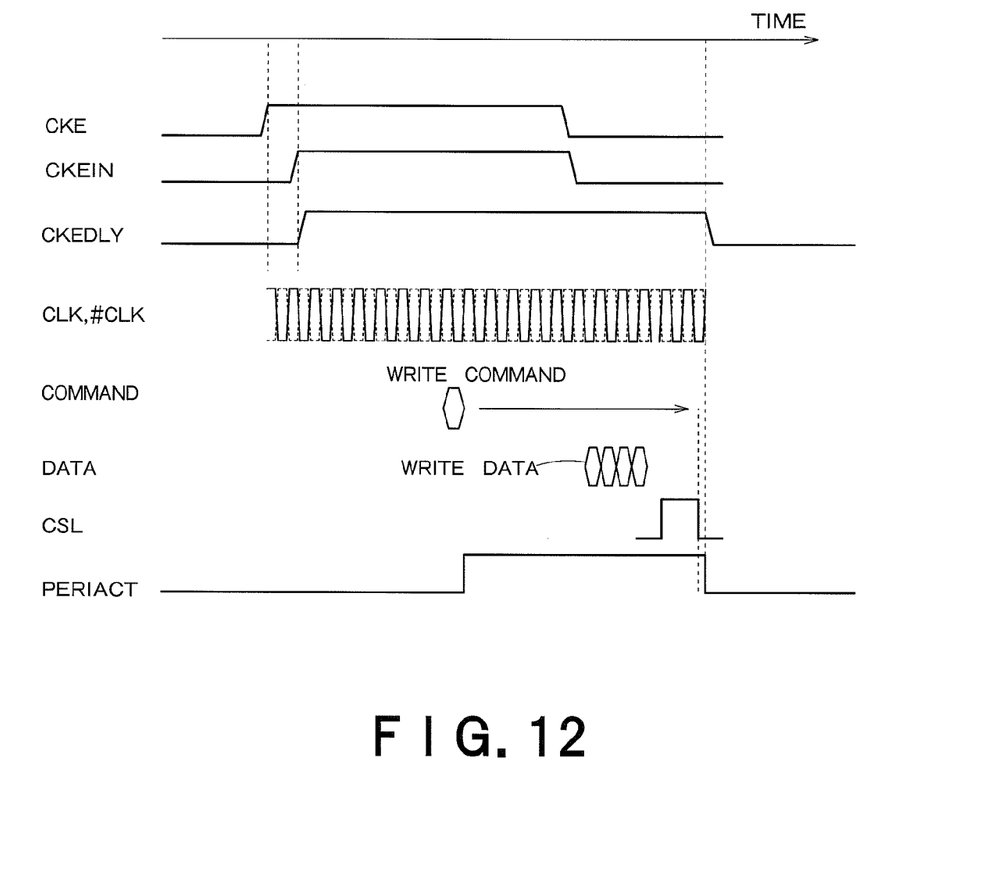
FIG. 12 is a transition diagram of the signals of the ferroelectric random access memory according to the second embodiment.

FIG. 12 shows an example of the transition of each signal in this embodiment. When power-down is notified during write of data (the CKE is brought to the low level) after a write command is issued from the memory controller to the ferroelectric random access memory, the signal CKEDLY maintains the high level until write is ended and is brought to the low level after the completion of write. After the write data are stored in the sense amplifier circuit SA, write (write back) to the memory cell MC is performed.

In this embodiment, data maintainability against instantaneous power-down during write of data can be improved.

The above embodiment is applicable, not only to the ferroelectric random access memory, but also to other destructive read type nonvolatile memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A ferroelectric random access memory comprising:
a first buffer configured to receive a power-down notification and configured to output a first signal, wherein the first buffer is configured to change the first signal from a first value to a second value based on the notification;
a second buffer configured to generate and supply an inner clock signal and configured to stop supplying the inner clock signal when the first signal changes from the first value to the second value;
a third buffer configured to receive, hold, and output an address signal;
a first controlling unit configured to receive and output a command signal;
a second controlling unit configured to generate and output a basic signal, wherein the basic signal comprises a third value when the command signal output from the first controlling unit comprises a bank active command, and wherein the basic signal comprises a fourth value when the command signal comprises a precharge command and the first signal comprises the second value;
a memory cell array comprising at least one memory cell, the memory cell comprising a ferroelectric capacitor and a cell transistor;
a sense amplifier configured to read data, via a pair of bit lines, from the memory cell corresponding to the address signal; and
a third controlling unit configured to write the data back to the memory cell corresponding to the address signal at a predetermined time after a time the basic signal changes to the third value and when the basic signal comprises the fourth value.

2. The ferroelectric random access memory according to claim 1, wherein the first buffer comprises a filter that removes noise.

3. The ferroelectric random access memory according to claim 1, wherein the predetermined time is longer than a time required for the sense amplifier circuit to read data from the memory cell via the pair of bit lines.

4. The ferroelectric random access memory according to claim 1, wherein the first buffer is configured to receive the notification via a CKE pin of a DDR interface.

5. The ferroelectric random access memory according to claim 1, further comprising a power source stabilization capacitor configured to supply backup power for a predetermined time when the first buffer receives the notification.

6. A ferroelectric random access memory comprising:
a first buffer configured to receive notification of power-down and outputs a first signal changed from a first value to a second value based on the notification;
a first controlling unit configured to receive and output a command signal and configured to generate and output a second signal, wherein the first controlling unit is configured to change the second signal from a third value to a fourth value when a write command is received and wherein the first controlling unit is configured to change the second signal from the fourth value to the third value after the elapse of a predetermined time after write data is received;

a delaying unit configured to generate and output a third signal, wherein the delaying unit is configured to change the third signal from a fifth value to a sixth value when the first signal changes from the second value to the first value, and wherein the delaying unit is configured to change the third signal from the sixth value to the fifth value when the first signal changes from the first value to the second value and the second signal comprises the third value;

a second buffer configured to generate and supply an inner clock signal and configured to stop supplying the inner clock signal when the third signal changes from the sixth value to the fifth value;

a third buffer configured to receive, hold, and output an address signal;

a second controlling unit configured to generate and output a basic signal, wherein the basic signal comprises a seventh value when the command signal output from the first controlling unit comprises a bank active command, and wherein the basic signal comprises an eighth value when the command signal comprises a precharge command and the third signal comprises the fifth value;

a memory cell array comprising at least one memory cell, the memory cell comprising a ferroelectric capacitor and a cell transistor;

a sense amplifier configured to read data, via a pair of bit lines, from the memory cell corresponding to the address signal; and a third controlling unit configured to write the data back to the memory cell corresponding to the address signal at a predetermined time after a time the basic signal changes to the seventh value and when the basic signal comprises the eighth value.

7. The ferroelectric random access memory according to claim 6, wherein the first buffer comprises a filter that removes noise.

8. The ferroelectric random access memory according to claim 6, wherein the first buffer is configured to receive the notification via a CKE pin of a DDR interface.

9. The ferroelectric random access memory according to claim 6, further comprising a power source stabilization configured to supply backup power for a predetermined time when the first buffer receives the notification.

10. The ferroelectric random access memory according to claim 1, further comprising:

a memory controller configured to output the command signal to the first controlling unit, configured to output the address signal to the third buffer, and configured to send power-down notification to the first buffer when a source voltage is detected and the source voltage is less than a predetermined value.

* * * * *